United States Patent [19]

Takemae et al.

[11] Patent Number: 4,481,610
[45] Date of Patent: Nov. 6, 1984

[54] DYNAMIC SEMICONDUCTOR MEMORY DEVICE

[75] Inventors: Yoshihiro Takemae; Hatsuo Miyahara, both of Yokohama, Japan

[73] Assignee: Fujitsu Limited, Kawasaki, Japan

[21] Appl. No.: 444,487

[22] Filed: Nov. 24, 1982

[30] Foreign Application Priority Data

Nov. 27, 1981 [JP] Japan .................. 56-190370

[51] Int. Cl.³ ............................................. G11C 11/40
[52] U.S. Cl. .................................. 365/182; 365/210; 365/222
[58] Field of Search ............... 365/174, 182, 189, 230, 365/210, 222

[56] References Cited

U.S. PATENT DOCUMENTS 4,363,111 12/1982 Heightley .......................... 365/210

Primary Examiner—Terrell W. Fears
Attorney, Agent, or Firm—Staas & Halsey

[57] ABSTRACT

A dynamic semiconductor memory device includes two bit lines connected to a sense amplifier and an active restore circuit which is formed from bit line pull-up transistors, each of which is connected between a bit line connected to the sense amplifier and a high potential source. In the active restore circuit, after the sense amplifier is actuated, the bit line pull-up transistor connected to the bit line on the high potential side is turned on by supplying a control signal to a gate so that the bit line is pulled up to a high voltage potential. The control signal is maintained at a voltage potential lower than the ground level from the time of actuation of the word line to the time of actuation of the sense amplifier.

4 Claims, 6 Drawing Figures

DYNAMIC SEMICONDUCTOR MEMORY DEVICE

BACKGROUND OF THE INVENTION

The present invention relates to a dynamic semiconductor memory device provided with an active restore circuit in which, in reading out data from a memory cell, the bit line voltage is not adversely influenced by the readout operation.

In a dynamic semiconductor memory device, a selected cell is connected to one of a pair of bit lines connected to a sense amplifier, and a dummy cell is connected to the other bit line so as to perform a readout operation. Further, an active restore circuit is connected to the pair of bit lines so that the bit line voltage is not adversely influenced by the readout operation.

That is, an active restore circuit of the above-mentioned type can ensure the detection of information in the memory cell by pulling up the bit line on the high potential side of the electric source to a power source voltage Vcc just after actuation of the sense amplifier.

However, as is described in detail hereinafter, the potential difference between the two bit lines is very small. Therefore, the sense amplifier sometimes cannot definitely distinguish the potential difference between the two bit lines, and, as a result, an error occurs in reading out the stored information.

SUMMARY OF THE INVENTION

An object of the present invention is to provide a dynamic semiconductor memory device having an active restore circuit in which information is accurately read out of a memory cell.

Another object of the present invention is to provide a dynamic semiconductor memory device having an active restore circuit in which charges other than the necessary charges are not supplied to the bit lines.

In order to achieve the above-mentioned objects, according to the present invention, there is provided a dynamic semiconductor memory device including: a selected real cell connected to a word line and to a first of a pair of bit lines connected to a sense amplifier. A dummy cell is connected to another word line and to a second of the pair of bit lines. An active restore circuit, which is formed from bit line pull-up transistors, each of which is connected between one of the bit lines and a high potential source level. A control signal is supplied to each of the bit line pull-up transistors after actuation of the sense amplifier. Each of the bit line pull-up transistors is then turned on so that the bit lines are pulled up to the high potential source level. The level of the control signal is maintained at a voltage potential level lower than ground level from the time of actuation of the word line to the time of actuation of the sense amplifier.

Further features and advantages of the present invention will be apparent from the ensuing description, with reference to the accompanying drawings, to which, however, the scope of the invention is in no way limited.

DESCRIPTION OF THE PREFERRED EMBODIMENT

Figure 1:
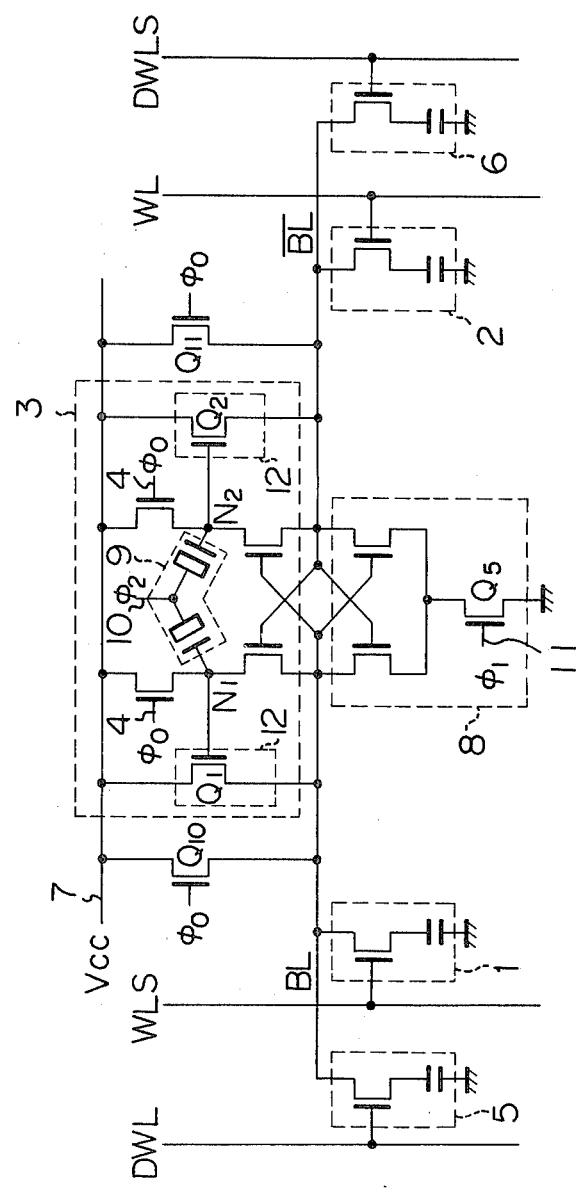
FIG. 1 is a circuit diagram of a conventional dynamic semiconductor memory device.

A conventional dynamic semiconductor memory device having an active restore circuit has the structure shown in FIG. 1. In FIG. 1, reference numerals 1 and 2 each represent a memory cell, reference numeral 3 represents an active restore circuit, reference numerals 5 and 6 each represent a dummy cell, reference numeral 7 represents a power source line, reference numeral 8 represents a sense amplifier, reference numeral 9 represents a metal-oxide semiconductor (MOS) capacitor, and reference numeral 12 represents a bit line pull-up transistor. The symbols BL and $\overline{BL}$ each represent a bit line, the symbol WL represents a word line, the symbol DWL represents a dummy word line, and the symbols WLS and DWLS represent a selected word line and a selected dummy word line, respectively.

The operation of the device shown in FIG. 1 will now be described with reference to the time chart shown in FIG. 2.

When stored information is read out of the memory cells 1 and 2, a clock pulse signal $\phi 0$ input to an operation control input 4 is set at a high level and transistors Q3 and Q4 are turned on to pre-charge nodes N1 and N2 to a high level. Furthermore, transistors Q10 and Q11 are turned on by the clock pulse signal $\phi 0$ to pre-charge the bit lines BL and $\overline{BL}$.

Figure 2:
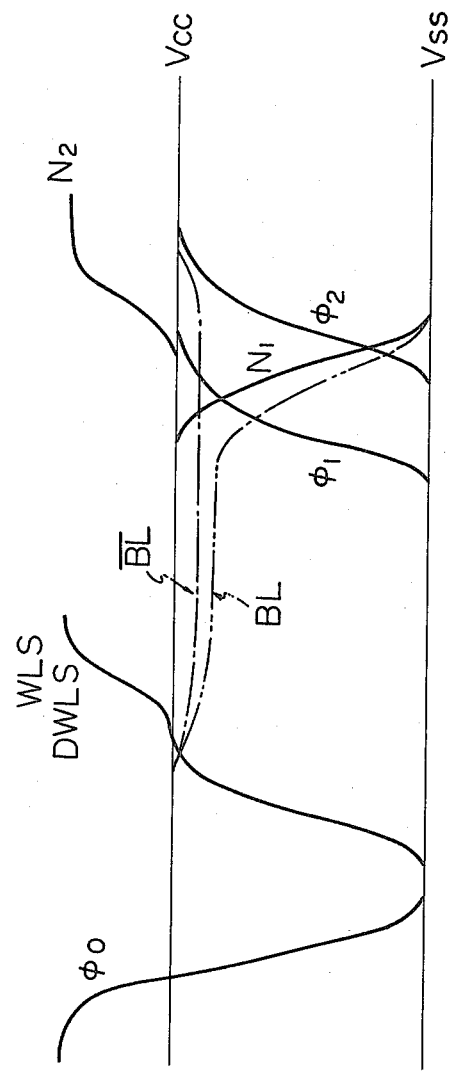
FIG. 2 is a graph of the waveforms of signals for operating the circuit shown in FIG. 1.

When readout of the information in the memory cell 1 is intended, as shown in FIG. 2, the word line WLS and the dummy word line DWLS are set at a high level, and the information stored in the memory cell 1 is read out of the memory cell 1. Since the potential of the bit line BL is changed according to the distribution of charges between the bit line BL and the memory cell 1, the potential of the bit line $\overline{BL}$ is changed according to the distribution of charge between the bit line $\overline{BL}$ and the dummy cell 6. When the information of the memory cell 1 is "0", the potential of the bit line BL is reduced to below the potential of the bit line $\overline{BL}$. Then a clock signal $\phi 1$ is set at a high level to actuate the sense amplifier 8. At this time, the potential of the bit line BL and the potential of the node N1 are reduced to ground potential Vss. Next, a clock pulse signal $\phi 2$ supplied to a terminal 10 is raised, and by capacitive coupling, the potential of the node N2 is set at a level higher than Vcc to turn on a bit line pull-up transistor Q2 and to raise the potential of the bit line $\overline{BL}$ to Vcc, whereby detection of the information in the memory cell is definitely accomplished.

In the prior art, when an active restore circuit is disposed in the dynamic semiconductor memory device, the following problem arises.

When the information in the memory cell 1 is "0", the word line WLS is driven and the memory cell 1 is selected, and although the potential of the bit line BL will drop, since the nodes N1 and N2 are pre-charged at a high potential level, if the potential of the bit line BL drops and the voltage between the gate and source of the transistor Q1 exceeds the threshold voltage Vth of the transistor Q1, the transistor Q1 is turned on and a charge is supplied to the bit line BL from the power source line 7 to inhibit dropping of the voltage of the bit line BL, with the result that the difference in voltage between the bit lines BL and $\overline{BL}$ is diminished (see FIG. 2).

Since the potential difference between the bit lines BL and $\overline{BL}$ is very small, detection of the information in the memory cell by the sense amplifier 8 is uncertain, and, as a result, an error occurs in reading out the stored information.

Figure 3:
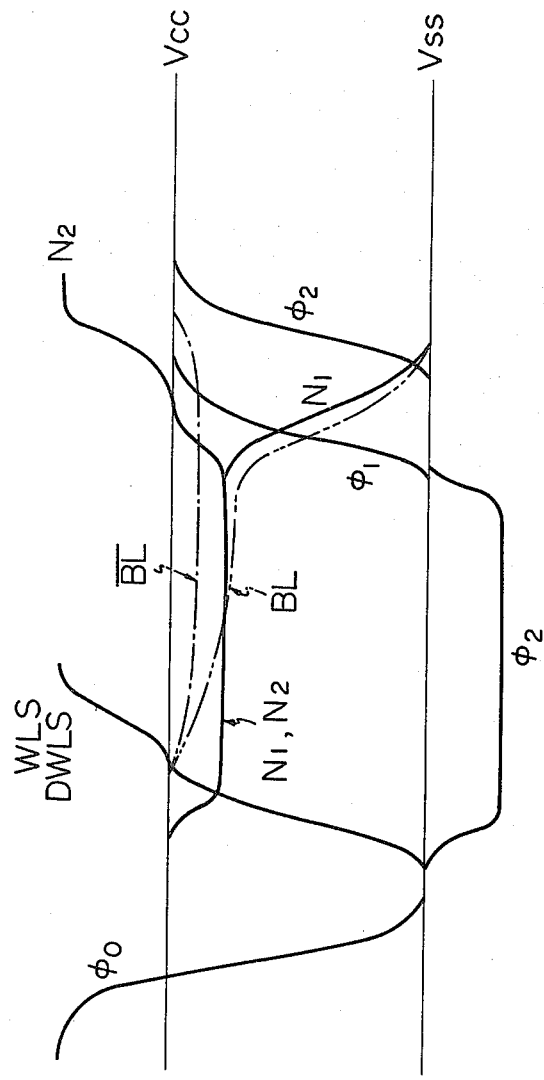
FIG. 3 is a graph of the signal waveforms for operating the circuit shown in FIG. 1 according to the present invention.

The specific circuit structure of the embodiment of the present invention is substantially the same as the structure of the conventional circuit shown in FIG. 1 except that, as shown in FIG. 3, the potential of the clock pulse signal $\phi_2$ supplied to the input terminal 10 of the MOS capacitor 9 is set at a level lower than the level of ground potential Vss during the period from the time of actuation of the word line WLS of the dynamic memory cell and the dummy word line DWLS of the dummy cell to the time of actuation of the sense amplifier 8, that is, the rising time of the clock pulse signal $\phi_1$ supplied to an operation control input 11, so that the active restore circuit 3 is not operated, that is, the transistors Q1 and Q2 are not turned on.

Figure 4:
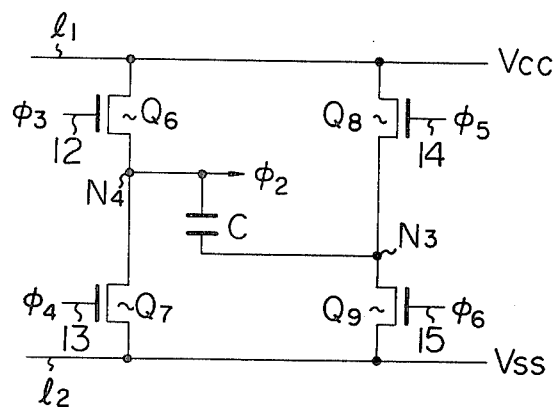
FIG. 4 is a bias voltage generating circuit for generating a clock signal $C\phi$ 2 of the signal waveform of FIG. 3.
Figure 5:
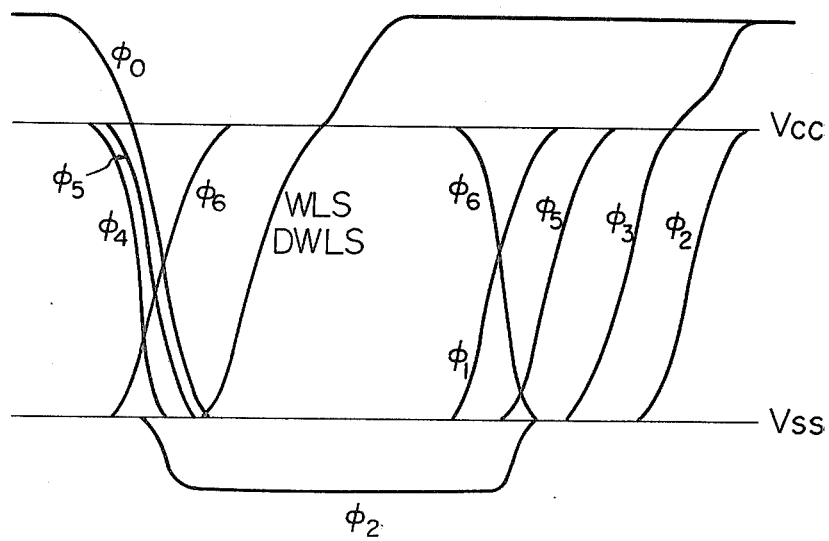
FIG. 5 is a graph of the signal waveforms for generating a control signal from the circuit shown in FIG. 4.

A circuit generating this clock pulse signal $\phi_2$ is shown in FIG. 4. This circuit comprises transistors Q6 and Q7 connected in series to each other between power source lines 11 and 12, transistors Q8 and Q9 connected in series to each other and parallel to the transistors Q6 and Q7, and a capacitor C connected between node N4, located between the transistors Q6 and Q7, and a node N3, located between the transistors Q8 and Q9. A voltage generated at the node N4 is used as the clock pulse signal $\phi_2$. Signals $\phi_3$ through $\phi_6$, having the voltage waveforms shown in FIG. 5, are supplied to gate inputs 12 through 15 of the transistors Q6 through Q9, respectively.

The operation of the circuit of the present invention having the above-mentioned structure will now be described.

Generation of the clock pulse signal $\phi_2$ is first described. When the clock pulse signals $\phi_4$ and $\phi_5$ are input to the gate inputs 13 and 14 of the circuit so as to set them at a high level, the transistors Q7 and Q8 are turned on, the node N4 is maintained at the voltage Vss (ground voltage level), and the node N3 is maintained at the voltage (Vcc-Vth), in which Vth represents the threshold voltage of the transistor Q8 and Vcc represents the voltage of the power source line 11. Then the clock pulse signals $\phi_4$ and $\phi_5$ are set at a low level, that is, at ground voltage Vss, so as to turn off the transistors Q7 and Q8. Next the clock pulse signal $\phi_6$ is supplied to the gate input 15 of the transistor 9 and maintained at a high level so as to set the node N3 at the voltage Vss. Accordingly, due to the capacitive coupling of the capacitor C, the voltage of the node N4 is set at a level ($\phi_2$ in FIG. 5) lower than the level of ground voltage Vss.

As shown in FIG. 3, the clock pulse signal $\phi_2$, which is lower than Vss, is supplied to the input terminal 10 of the MOS capacitor 9 during the period from the time of actuation of the word line WLS to the time of actuation of the sense amplifier (the rising of the clock signal $\phi_1$). This voltage causes the potentials of the nodes N1 and N2 to drop, with the result that operation of the bit line pull-up transistors 12 of the active restore circuit 3 is not effected. Accordingly, dropping of the voltage of the bit line BL is increased, and the difference between the potential of the bit line BL and the potential of the bit line $\overline{BL}$ is definitely detected by the sense amplifier. In the conventional circuit, this potential difference is diminished, and, as a result, an error is often made in reading out stored information. According to the present invention, however, this error can effectively be prevented.

Figure 6:
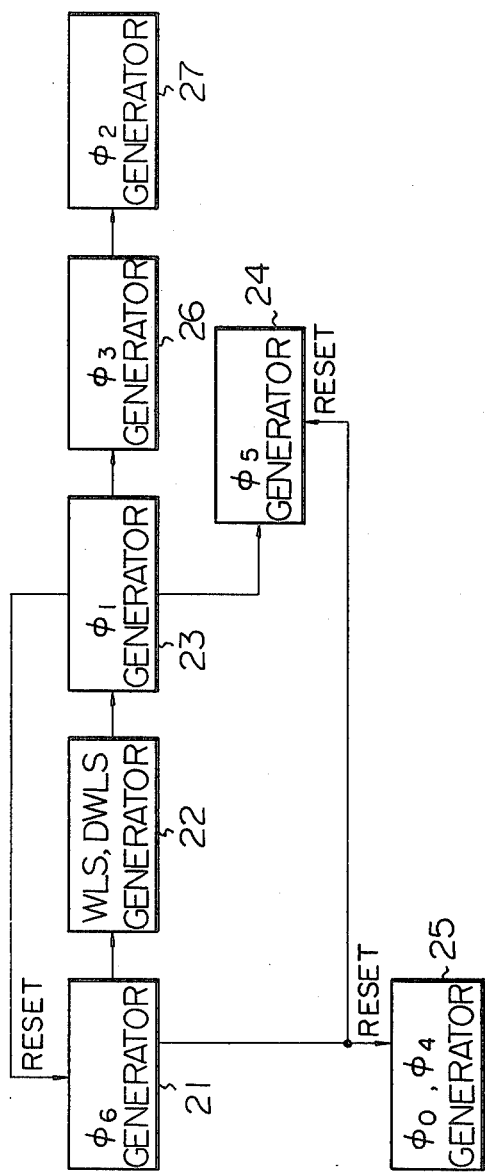
FIG. 6 is a block diagram of the means for generating the waveforms shown in FIG. 5.

The control signals $\phi_3$, $\phi_4$, $\phi_5$, and $\phi_6$ in FIG. 4, the word line drive signals WLS and DWLS, and the clock pulse signals $\phi_0$, $\phi_1$, and $\phi_2$ are generated by the circuit shown in FIG. 6. In FIG. 6, $\phi_6$ generator 21 is connected to WLS, DWLS generator 22 and, further, to $\phi_1$ generator 23 which resets the output of the $\phi_6$ generator 21. The output of the $\phi_1$ generator 23 is connected to the $\phi_5$ generator 24, which is actuated due to a time delay and reset by the rising portion of the output of the $\phi_6$ generator 21. The output of $\phi_0$, $\phi_4$ generator 25 is also reset by the rising portion of the output of the $\phi_6$ generator 21. The output of the $\phi_1$ generator 23 is connected to the $\phi_3$ generator 26, which is actuated due to a time delay and which generates an output having a value higher than the source voltage Vcc. The output of the $\phi_3$ generator 26 is connected to the $\phi_2$ generator 27, which generates the clock pulse signal $\phi_2$ due to a time delay at the output of the $\phi_3$ generator 26.

The foregoing description was given with reference to a case where the memory cell 1 on the side of the bit line BL is selected. In the present invention, when the memory cell 2 on the side of the bit line $\overline{BL}$ is selected, the above-mentioned effect can similarly be attained.

As will be apparent from the foregoing description, according to the present invention, the active restore circuit is not actuated during the period from the time of actuation of the word line to the time of actuation of the sense amplifier even if the voltage of the bit line is dropped due to the reading out of stored information. As a result, the potential difference between the bit lines can definitely be detected. Therefore, the problem which often occurs in the conventional circuit, that is, the erroneous reading out of stored information, can be effectively prevented.

We claim:

1. A dynamic semiconductor memory device, operatively connected to receive a control signal, having word lines, a pair of bit lines intersecting the word lines and a sense amplifier operatively connected to the bit line pair, comprising:
   a selected real cell operatively connected to a first one of the word lines and a first bit line of the pair of bit lines; and
   an active restore circuit, operatively connected to the pair of bit lines, including bit line pull-up transistors, each of said bit line pull-up transistors operatively connected between the bit line pair and a high potential source level, the control signal being supplied to each of said bit line pull-up transistors after actuation of the sense amplifier, each of said bit line pull-up transistors being turned on so that the bit line pair is pulled up to the high potential source level, the level of said control signal being maintained at a voltage potential level lower than the ground level before or at the time of actuation of the first one of the word lines to the time of actuation of the sense amplifier.

2. A dynamic semiconductor memory device according to claim 1, wherein the circuit by which the level of the control signal is maintained at a voltage potential level lower than the ground level comprises:
- first and second transistors operatively connected in series and forming a first connection node therebetween, and operatively connected between the high potential source level and the ground level, each of said first and second transistors having a gate;
- third and fourth transistors, operatively connected in series and forming a second connection node therebetween, and operatively connected between the high potential source level and the ground level, each of said third and fourth transistors having a gate; and
- a capacitor connected between the first connection node and the second connection node, said second and third transistors being turned on so that the first connection node is maintained at the ground level and the second connection node is maintained at the high potential source level at the time of actuation of the first one of the word lines, said second and third transistors then being turned off, and a high level clock pulse signal being supplied to the gate of said fourth transistor so that a voltage level lower than the ground level is present at the first connection node, and when the sense amplifier is actuated, a pulse having a value higher than the high potential source level is supplied to the gate of said first transistor.

3. A dynamic semiconductor device operatively connectable to receive a high potential source level, comprising:
- a sense amplifier;
- a pair of bit lines operatively connected to said sense amplifier;
- word lines intersecting said pair of bit lines;
- a memory cell operatively connected to one of said word lines; and
- an active restore circuit, operatively connected to said pair of bit lines, comprising:
- means for generating a control signal, the control signal having a voltage potential lower than ground level during a predetermined time; and bit line pull-up transistors, operatively connected to said pair of bit lines and said control signal generating means and operatively connected to receive the high potential source level, said bit line pull-up transistors being turned on upon receipt of the control signal to pull-up said bit line pairs to the high potential source level.

4. A semiconductor memory device according to claim 3, wherein said means for generating the control signal comprises:
- a first transistor operatively connected to receive the high potential source level;
- a second transistor operatively connected to said first transistor at a first connection node and operatively connected to ground;
- a third transistor operatively connected to receive the high potential source level;
- a fourth transistor operatively connected to said third transistor at a second connection node and operatively connected to ground; and
- a capacitor operatively connected between the first and second connection nodes, wherein when said second and third transistors are turned on, the first connection node is at ground level and the second connection node is at the high potential source level, and wherein when said second and third transistors are turned off the first connection node is at a level lower than ground level.

* * * * *

UNITED STATES PATENT AND TRADEMARK OFFICE
CERTIFICATE OF CORRECTION

PATENT NO. : 4,481,610
DATED : NOVEMBER 6, 1984
INVENTOR(S) : YOSHIHIRO TAKEMAE ET AL.

It is certified that error appears in the above-identified patent and that said Letters Patent is hereby corrected as shown below:

Col. 1, line 42, "including:" should be --including--.

Col. 3, line 32, "11 and 12," should be --$\ell 1$ and $\ell 2$,--; line 53, "11" should be --$\ell 1$--.

Col. 6, line 8, after "and", start a new paragraph with the word "bit".

Signed and Sealed this

Sixth Day of August 1985

[SEAL]

Attest:

DONALD J. QUIGG

Attesting Officer    Acting Commissioner of Patents and Trademarks